(12) United States Patent
Lee et al.

(10) Patent No.: US 9,229,488 B2
(45) Date of Patent: Jan. 5, 2016

(54) ORGANIC LIGHT EMITTING DISPLAY DEVICES AND METHODS OF MANUFACTURING ORGANIC LIGHT EMITTING DISPLAY DEVICES

(71) Applicant: Samsung Display Co., LTD., Yongin, Gyeonggi-Do (KR)

(72) Inventors: Hyun-Jae Lee, Seoul (KR); Seong-Min Wang, Yongin (KR); Hee-Soo Yoo, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 58 days.

(21) Appl. No.: 14/043,196

(22) Filed: Oct. 1, 2013

(65) Prior Publication Data
US 2014/0239802 A1  Aug. 28, 2014

(30) Foreign Application Priority Data

Feb. 28, 2013 (KR) .......................... 10-2013-0021679

(51) Int. Cl.
*G06F 1/16* (2006.01)
*H04M 1/02* (2006.01)

(52) U.S. Cl.
CPC ............ *G06F 1/1684* (2013.01); *G06F 1/1637* (2013.01); *H04M 1/0266* (2013.01)

(58) Field of Classification Search
CPC ... G06F 1/1626; G06F 1/1637; G06F 1/1643; H04M 1/0266
See application file for complete search history.

(56) References Cited

U.S. PATENT DOCUMENTS

| | | | |
|---|---|---|---|
| 2002/0135570 A1* | 9/2002 | Iisaka et al. | 345/177 |
| 2002/0135708 A1* | 9/2002 | Murden et al. | 349/19 |
| 2010/0254547 A1 | 10/2010 | Grosh et al. | |
| 2013/0037818 A1 | 2/2013 | Lee et al. | |

FOREIGN PATENT DOCUMENTS

| | | |
|---|---|---|
| KR | 1020020075283 A | 10/2002 |
| KR | 1020030003292 A | 1/2003 |
| KR | 1020110025697 A | 10/2009 |
| KR | 1020130017342 A | 2/2013 |

* cited by examiner

*Primary Examiner* — Mary Ellen Bowman
(74) *Attorney, Agent, or Firm* — Cantor Colburn LLP

(57) ABSTRACT

An organic light emitting display device and a method of manufacturing an organic light emitting display device are disclosed. The organic light emitting display device includes a first substrate, on which a display region and a non-display region surrounding the display region are defined, a second substrate disposed opposite to the first substrate, an organic light emitting element disposed in the display region between the first substrate and the second substrate, a third substrate disposed opposite to the second substrate, and a microphone disposed between the second substrate and the third substrate.

14 Claims, 9 Drawing Sheets

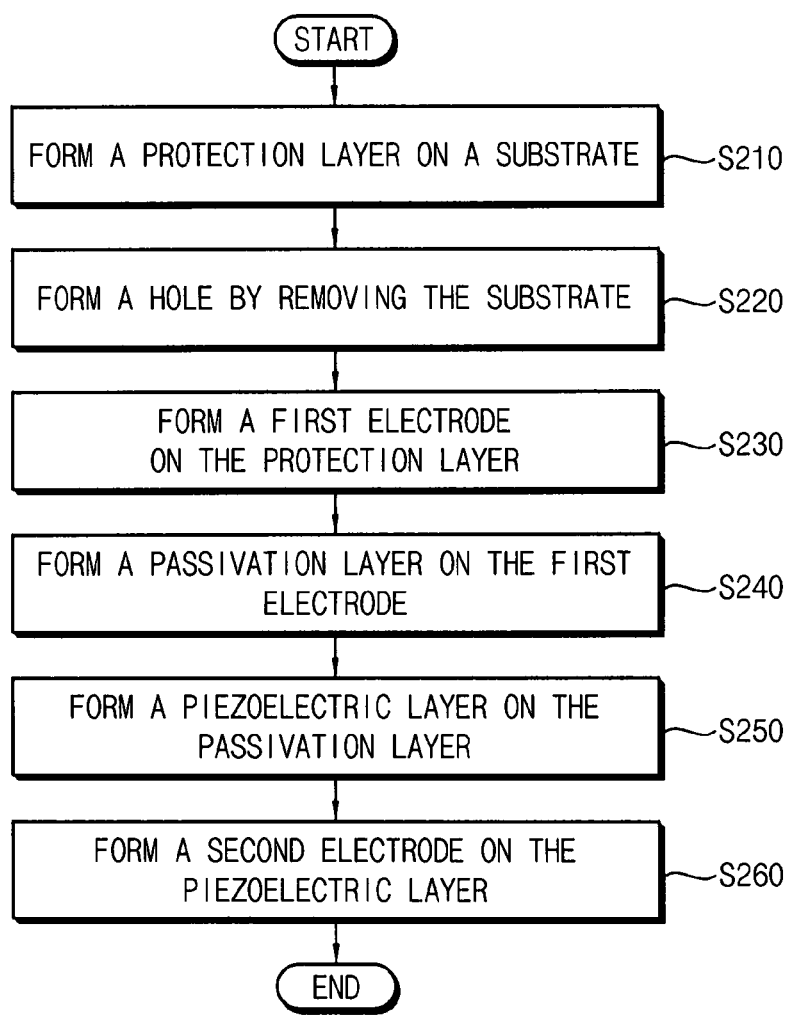

ORGANIC LIGHT EMITTING DISPLAY DEVICES AND METHODS OF MANUFACTURING ORGANIC LIGHT EMITTING DISPLAY DEVICES

This application claims priority to Korean Patent Application No. 10-2013-0021679, filed on Feb. 28, 2013, and all the benefits accruing therefrom under 35 U.S.C. §119, the content of which in its entirety is herein incorporated by reference.

BACKGROUND

1. Field

Exemplary embodiments relate to an organic light emitting display device and a method of manufacturing the organic light emitting display device.

2. Description of the Related Art

An organic light emitting display ("OLED") device displays information of images or characters using light generated as holes and electrons, which are provided from an anode and a cathode, respectively, are combined with each other at an organic light emitting layer interposed between the anode and the cathode. The OLED devices have been widely used due to the properties thereof such as a wide viewing angle, a rapid response speed, a thin thickness and low power consumption, for example.

When the OLED device is used in an electronic apparatus such as a smart phone, a microphone for inputting sound signal may be further disposed in the OLED devices. However, in a conventional OLED device, an additional space is typically provided in the OLED device to receive the microphone.

SUMMARY

Some exemplary embodiments provide an organic light emitting display device including a microphone embedded therein.

Some exemplary embodiments provide a method of manufacturing an organic light emitting display device including an embedded microphone.

According to an exemplary embodiment, an organic light emitting display device includes a first substrate, on which a display region and a non-display region surrounding the display region are defined, a second substrate disposed opposite to the first substrate, an organic light emitting element disposed in the display region between the first substrate and the second substrate, a third substrate disposed opposite to the second substrate, and a microphone disposed between the second substrate and the third substrate.

In an exemplary embodiment, the microphone may be disposed in the display region.

In an exemplary embodiment, the microphone may include a first electrode, a piezoelectric layer and a second electrode, which are disposed on a surface of the third substrate. In such an embodiment, a hole corresponding to the microphone may be defined through the third substrate.

In an exemplary embodiment, each of the first electrode, the piezoelectric layer and the second electrode may be divided into a plurality of portions, which are spaced apart from each other in a direction substantially parallel to the surface of the third substrate with a gap.

In an exemplary embodiment, the microphone may include a first electrode, a piezoelectric layer and a second electrode, which are disposed on a surface of the second substrate, and a hole corresponding to the microphone may be defined in the second substrate.

In an exemplary embodiment, the hole may extend in a direction substantially parallel to the surface of the second substrate.

In an exemplary embodiment, the piezoelectric layer may include zinc oxide, aluminum nitride or lead zirconium titanate.

In an exemplary embodiment, the microphone may be disposed in the non-display region.

In an exemplary embodiment, the microphone may include a first electrode, a piezoelectric layer and a second electrode which are disposed on a surface of the second substrate, and a hole corresponding to the microphone may be defined through the second substrate.

In an exemplary embodiment, the organic light emitting display device includes a circuit substrate including a microphone circuit portion, a sound signal processor and a microphone impedance matching block. In such an embodiment, the microphone may be electrically connected to the microphone circuit portion, the sound signal processor and the microphone impedance matching block by a wiring.

In an exemplary embodiment, a plurality of microphones may be disposed in the non-display region, and the microphones may be disposed adjacent to at least three sides of the display region.

In an exemplary embodiment, the microphone may detect a three dimensional sound signal.

According to another exemplary embodiment, a method of manufacturing an organic light emitting display device includes providing a first substrate, on which a display region and a non-display region surrounding the display region are defined, providing an organic light emitting element in the display region on the first substrate, providing a second substrate to face the first substrate, combining the first substrate and the second substrate to encapsulate the organic light emitting element therebetween, providing a microphone on a third substrate, and combining the second substrate and the third substrate.

In an exemplary embodiment, the method may further include providing a wiring on the second substrate before the combining the second substrate and the third substrate, where the combining the second substrate and the third substrate comprises electrically connecting the wiring with the microphone.

In an exemplary embodiment, the providing the microphone on the third substrate may include providing a protection layer on the third substrate, partially removing the third substrate to form a hole therein, providing a first electrode on the protection layer, providing a piezoelectric layer on the first electrode, and providing a second electrode on the piezoelectric layer.

According to exemplary embodiments, the organic light emitting panel may include the microphone embedded in a display region. In such embodiments, an additional space for receiving the microphone may be omitted in a non-display region, and the size of the non-display region may be substantially reduced. In such embodiments, the hole corresponding to the microphone may be defined not to penetrate the first substrate and the second substrate, which may encapsulate the organic light emitting element, such that the life time of the organic light emitting element may increase.

BRIEF DESCRIPTION OF THE DRAWINGS

The above and other features of the invention will become more apparent by describing in detailed exemplary embodiments thereof with reference to the accompanying drawings, in which:

FIG. 13 is a flow chart showing an exemplary embodiment of a method of manufacturing an organic light emitting display device including a microphone.

DETAILED DESCRIPTION

Figure 1:
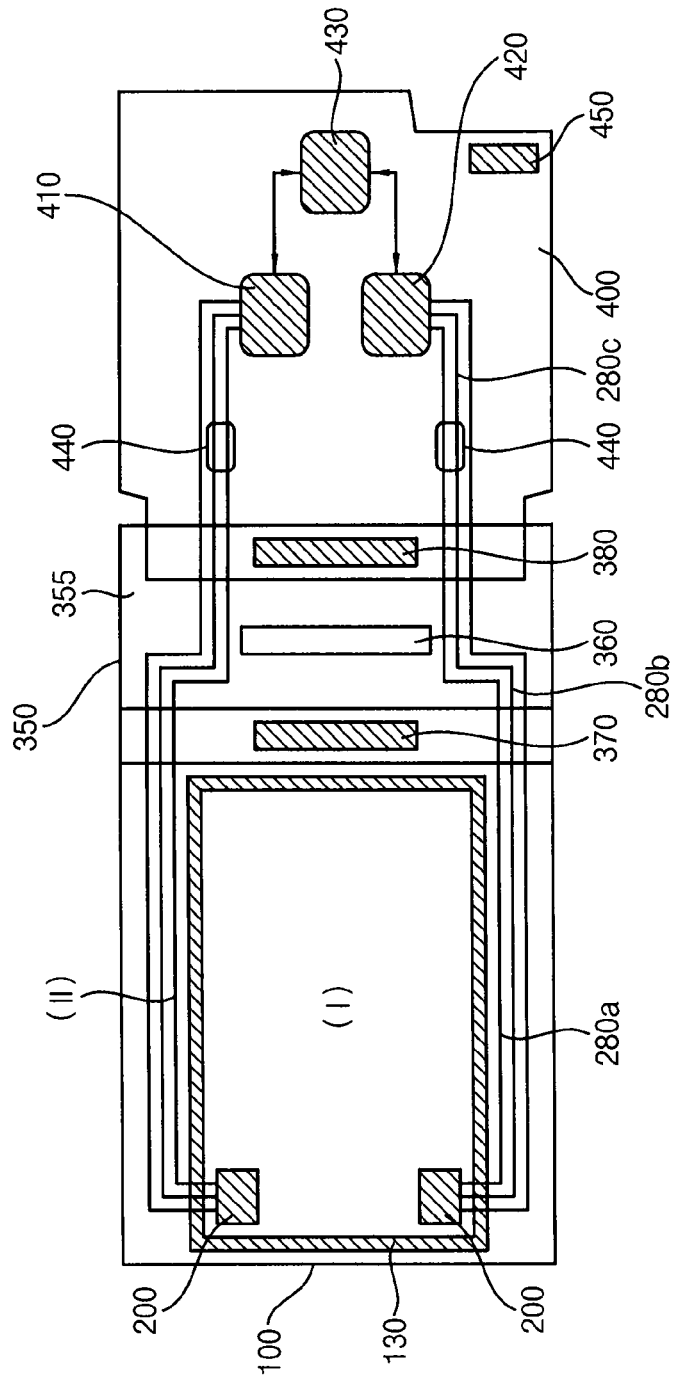
FIG. 1 is a plan view of an exemplary embodiment of an organic light emitting display device.

The invention will be described more fully hereinafter with reference to the accompanying drawings, in which exemplary embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like numerals refer to like elements throughout.

It will be understood that, although the terms first, second, third etc. may be used herein to describe various elements, components, regions, layers and/or sections, these elements, components, regions, layers and/or sections should not be limited by these terms. These terms are used to distinguish one element, component, region, layer and/or section from another element, component, region, layer and/or section. Thus, a first element, component, region, layer or section discussed below could be termed a second element, component, region, layer or section without departing from the teachings of the invention. As used herein, the term "and/or" includes any and all combinations of one or more of the associated listed items.

It will be understood that when an element or layer is referred to as being "connected" or "coupled" to another element or layer, it can be directly connected or coupled to the other element or layer or intervening elements or layers may be present. In contrast, when an element or layer is referred to as being "directly connected" or "directly coupled" to another element or layer, there are no intervening elements or layers present. Other words used to describe the relationship between elements should be interpreted in a like fashion (e.g., "between" versus "directly between," "adjacent" versus "directly adjacent," etc.).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

Figure 2:
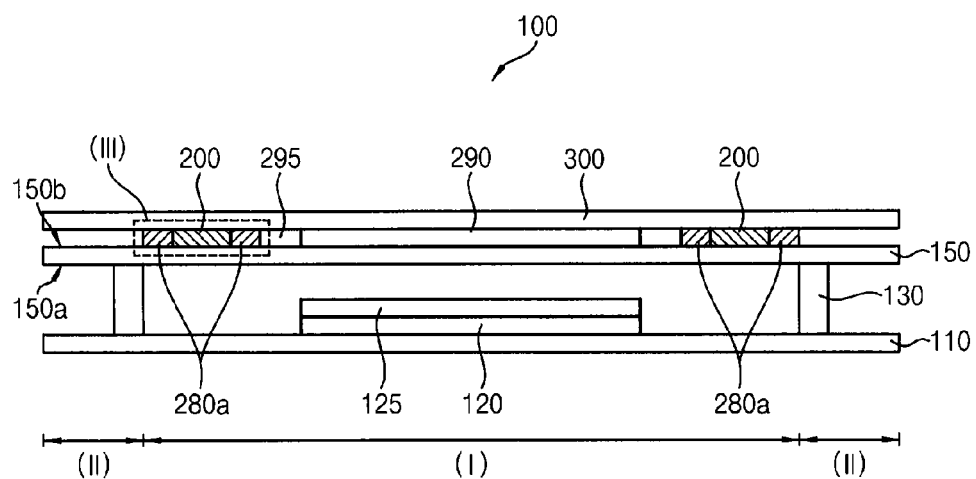
FIG. 2 is a cross-sectional view illustrating region I and region II of the organic light emitting display device shown in FIG. 1.
Figure 3:
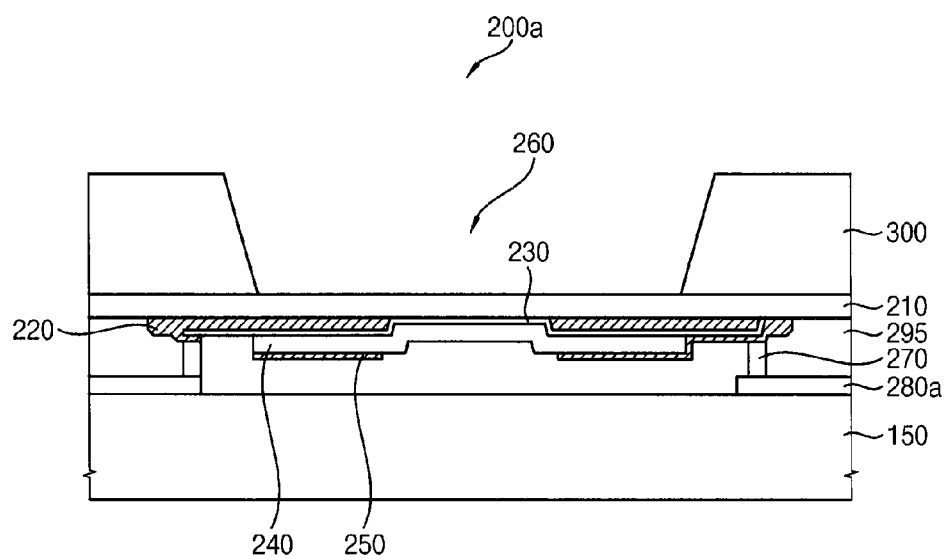
FIG. 3 is an enlarged cross-sectional view of an exemplary embodiment of a microphone, corresponding to region III of FIG. 2.

FIG. 1 is a plan view illustrating an exemplary embodiment of an organic light emitting display device, FIG. 2 is a cross-sectional view illustrating region I and region II of the organic light emitting display device of FIG. 1, and FIG. 3 is an enlarged cross-sectional view of an exemplary embodiment of a microphone, corresponding to region III of FIG. 2.

Referring to FIG. 1, an exemplary embodiment of the organic light emitting display device may include an organic light emitting panel 100, a circuit substrate 400 and a wiring substrate 350 that connects the organic light emitting panel 100 and the circuit substrate 400.

In an exemplary embodiment, the organic light emitting panel 100 may include a switching element 120, an organic light emitting element 125, and a microphone 200 that converts a sound signal into an electrical signal. In such an embodiment, the microphone 200 may be electrically connected to a circuit portion 410 of the circuit substrate 400 through wirings, e.g., first wirings 280a, second wirings 280b and third wiring 280c. The organic light emitting panel 100 will be described later in detail with reference to FIG. 2.

In an exemplary embodiment, as shown in FIG. 1, the wiring substrate 350 may include a flexible film 355 and a driver integrated circuit ("IC") 360. The driver IC 360 disposed on the flexible film 355 may convert a pixel data into an analogue pixel signal, and may transmits the analogue pixel signal to the switching element 120 of the organic light emitting panel 100. In such an embodiment, the driver IC 360 may control a power supplied to the organic light emitting panel 100.

In an exemplary embodiment, the flexible film 355 may include a flexible polymer, and the wiring substrate 350 may electrically connect a surface, e.g., a front surface, of the organic light emitting panel 100 with the circuit substrate 400, which may be disposed on a surface, e.g., a rear surface, of the organic light emitting panel 100.

The wiring substrate 350 may be connected to the front surface of the organic light emitting panel 100 through a first contact portion 370, and may be connected to the circuit substrate 400 through a second contact portion 380. In an exemplary embodiment, each of the first contact portion 370 and the second contact portion 380 may include a plurality of pads (not shown). The plurality of pads may be electrically connected to each other through an anisotropic conductive film ("ACF"). In an exemplary embodiment, the plurality of pads and the ACF may be fixed or attached to each other by a thermal pressing process or an ultra-sonic pressing process.

In an exemplary embodiment, the second wirings 280b may be disposed on the flexible film 355. In an exemplary embodiment, as illustrated in FIG. 1, the second wirings 280b may be electrically connected to the first wirings 280a disposed on the organic light emitting panel 100 independently of the first contact portion 370. In one exemplary embodiment, for example, the second wirings 280b may be directly connected to the first wirings 280a not through the first contact portion 370. In an alternative exemplary embodiment, the second wiring 280b may be electrically connected to the first wirings 280a through the first contact portion 370.

In an exemplary embodiment, as shown in FIG. 1, the wiring substrate 350 may include a chip on film ("COF") package, but not being limited thereto. In an alternative exemplary embodiment, for example, the wiring substrate 350 may include a tape carrier package ("TCP") or a flexible printed circuit ("FPC").

Referring now to FIG. 1, the circuit substrate 400 includes a microphone impedance matching block 440, microphone circuit portions 410 and 420 and a sound signal processor 430, which are disposed, e.g., mounted, thereon. The microphone impedance matching block 440, the microphone circuit portions 410 and 420 and the sound signal processor 430 may be electrically connected to the microphone 200 of the organic light emitting panel 100 through the third wirings 280c, which is connected to the first wirings 280a on the organic light emitting panel 100 via the second wirings 280b on the wiring substrate 250. In such an embodiment, the circuit substrate 400 may include a connector, e.g., a bus-to-bus ("B-to-B") connector, such that the circuit substrate may be connected to other component such as a main board, for example.

The microphone impedance matching block 440 may be connected to the microphone 200 through the wirings 280a, 280b and 280c. The microphone impedance matching block 440 may compensate a fluctuation of the electrical signal due to the physical property of the wirings 280a, 280b and 280c and environmental conditions.

The microphone circuit portions 410 and 420 may be electrically connected to the microphone impedance matching block 440 and the microphone 200 through wirings 280a, 280b and 280c. In one exemplary embodiment, for example, the microphone circuit portions 410 and 420 may include analogue circuits such as an amplifier for amplifying the electrical signal from the microphone 200. In such an embodiment, the microphone circuit portions 410 and 420 may further include electrostatic discharge ("ESD") protection circuits and/or ground line switching circuits.

In an exemplary embodiment, the sound signal processor 430 may convert an analogue input signal from the microphone circuit portions 410 and 420 to a digital output signal using coder/decoder ("CODEC"). In an alternative exemplary embodiment, the sound signal processor 430 may be omitted, and the analogue input signal may be transferred to a processor, e.g. central processing unit ("CPU") or application processor ("AP") of the main board, through the connector 450.

Referring to FIG. 2, the organic light emitting panel 100 may include a first substrate 110, the switching element 120, the organic light emitting element 125, a sealant 130, a second substrate 150, the microphone 200, the first wirings 280a, a transparent circuit device 290 and a third substrate 300, and the like.

In an exemplary embodiment, the switching element 120 and the organic light emitting element 125 may be disposed between the first substrate 100 and a first surface 150a of the second substrate 150. The switching element 120 and the organic light emitting element 125 may be enclosed by the sealant 130. In an exemplary embodiment, the transparent circuit device 290, the microphone 200 and the first wirings 280a may be disposed between the third substrate 300 and a second surface 150b of the second substrate 150.

The first substrate 110 may include a transparent substrate. In one exemplary embodiment, for example, the first substrate 110 may include a glass substrate, a quartz substrate, a transparent plastic substrate, a transparent ceramic substrate, or the like. In an exemplary embodiments, the first substrate 110 may be a flexible substrate.

The first substrate 110 may be divided into a display region I and a non-display region II. The non-display region II may surround at least one side of the display region I. In one exemplary embodiment, for example, the non-display region II may surround four sides of the display region I.

In an exemplary embodiment, the organic light emitting panel 100 may be an active matrix type panel, and the switching element 120 may be disposed on the first substrate 110. In one exemplary embodiment, for example, the switching element 120 may include a switching device such as a thin film transistor and a plurality of insulation layers.

In an exemplary embodiment, the switching element may include a gate electrode, a source electrode, a drain electrode, an active pattern, and the like.

The organic light emitting element 125 may be disposed in the display region I on the switching element 120, and may include a plurality of organic layers. In one exemplary embodiment, for example, the organic light emitting element 125 may include a hole transfer layer ("HTL"), a hole injection layer ("HIL"), an organic light emitting layer ("EL"), an electron transfer layer ("ETL"), an electron injection layer ("EIL"), and the like. The organic light emitting layer may include a light emitting material for emitting red light, green light and/or blue light.

In an exemplary embodiment, a peripheral circuit portion (not shown) may be disposed in the non-display region II on the first substrate 110 shown in FIG. 1. In one exemplary embodiment, for example, the peripheral circuit portion may include a gate driving circuit, a data driving circuit, a common power bus line, a driving power line, and the like. The peripheral circuit portion may receive an electrical signal and may transfer the electric signal to the switching element 120 and the organic light emitting element 125.

Referring back to FIG. 2, the second substrate 150 may be disposed above the first substrate 110. The second substrate 150 may have the first surface 150a facing the first substrate 110 and the second surface 150b opposite to the first surface 150a. The second substrate 150 may include a transparent substrate. In one exemplary embodiment, for example, second substrate 150 may include a glass substrate, a quartz substrate, a transparent plastic substrate, a transparent ceramic substrate, or the like. The second substrate 150 may protect the switching element 120 and the organic light emitting element 125 from an external impact.

In an exemplary embodiment, the sealant 130 may be disposed between the first substrate 110 and the second substrate 150. The sealant 130 may be bonded to the first substrate 110 and the second substrate 150, and may encapsulate a space defined between the first substrate 110 and the second substrate 150 along with the first substrate 110 and the second substrate 150. In such an embodiment, the sealant 130 may effectively prevent the organic light emitting element 125 from being deteriorated by contaminants or vapor. In one exemplary embodiment, for example, the sealant 130 may form a closed loop to surround the display region I.

In an exemplary embodiment, the organic light emitting panel 100 may have a top emission type panel as illustrated in FIG. 2, but not being limited thereto. In one alternative exemplary embodiment, for example, the organic light emitting panel 100 may have a bottom emission type panel.

The transparent circuit device 290 may be disposed on the second surface 150a of the second substrate 150. In an exemplary embodiment, the transparent circuit device 290 may be a touch sensing device which converting a touch thereon into an electrical signal. In one exemplary embodiment, for example, the touch sensing device may include touch sensing patterns including a transparent conductive material such as indium tin oxide ("ITO"). The transparent circuit device 290 may be electrically connected to the circuit portion.

The third substrate 300 may be disposed opposite to, e.g., facing, the second surface 150a of the second substrate 150. The third substrate 300 may include a transparent material. In an exemplary embodiment, the third substrate 300 may include a glass substrate, a quartz substrate or a transparent plastic substrate. In one exemplary embodiment, for example, the third substrate 300 may be a window of the organic light emitting display device.

In an exemplary embodiment, as shown in FIG. 2, the microphone 200 may be disposed in the display region I between the second substrate 150 and the third substrate 300. In such an embodiment, the microphone 200 may be embedded in the organic light emitting panel 100. The microphone 200 may be disposed in the display region I, such that a space for receiving the microphone 200 may not be provided in the non-display region II.

In an exemplary embodiment, a plurality of microphones 200 may be disposed in the display region I, and each of the microphones 200 may be a thin film type microphone. The microphones may receive a sound signal. In such an embodiment, where the plurality of microphones 200 are arranged in the organic light emitting panel 100, the quality of the received sound signal is substantially improved.

The microphone 200 may be electrically connected to the first wirings 280a disposed on the second surface 150a of the second substrate 150. In exemplary embodiments, the microphone 200 may have various configurations. That is, exemplary embodiments of the microphone, e.g., the microphone 200a illustrated in FIG. 3, the microphone 200b illustrated in FIG. 4 and the microphone 200c illustrated in FIG. 5, may have different configurations from each other.

Referring to FIG. 3, an exemplary embodiment of the microphone 200a may include a protection layer 210, a first electrode 220, a passivation layer 230, a piezoelectric layer 240 and a second electrode 250, which may be sequentially stacked on the third substrate 300, through which a hole 260 is defined.

The protection layer 210 may be disposed on a surface of the third substrate 300 facing the second substrate 150. The protection layer 210 may be arranged to cover a portion of the second substrate 150, which is exposed by the hole 260 of the third substrate 300. The protection layer 210 may function as a diaphragm which vibrates based on the sound signal. In an exemplary embodiment, the protection layer 210 may include a material which may have an etch selectivity with respect to a material of the third substrate 300. In one exemplary embodiment, for example, the protection layer 210 may include silicon nitride (SiNx), and the protection layer 210 may function as an etch stop layer in a process of forming the hole 260.

The first electrode 220 may be disposed on a surface of the protection layer 210. The first electrode 220 may include a conductive metal such as aluminum, copper, and the like, for example. In an exemplary embodiment, the first electrode 220 may have a planar shape such as a circular ring or a polygonal ring, for example.

The passivation layer 230 may be disposed on the protection layer 210 and between the first electrode 220 and the piezoelectric layer 240. The passivation layer 230 may include an insulation material such as silicon oxide, for example, and may have a relatively small thickness.

The piezoelectric layer 240 may be disposed on the passivation layer 230, and may have a planar shape such as a circular shape or a polygonal shape, for example. The piezoelectric layer 240 may include a piezoelectric ceramic material such as zinc oxide (ZnO), aluminum nitride (AlN) or lead zirconium titanate ("PZT"), and the like, for example. The piezoelectric layer 240 may have a single layer structure or a multi-layer structure.

The second electrode 250 may be disposed on the piezoelectric layer 240. The second electrode 250 may include a material substantially the same as or substantially similar to the material of the first electrode 220.

Referring to FIG. 3, the third substrate 300 may include the hole 260 defined therethrough, e.g., a hole 260 penetrating the third substrate 300 substantially in a thickness direction. The hole 260 may penetrate the third substrate 300, and may not extend to the first substrate 110 and the second substrate 150, such that the organic light emitting element 125 may be effectively encapsulated by the first substrate 110 and the second substrate 150. The hole 260 may be arranged to expose to a portion of the protection layer 210 corresponding to the piezoelectric layer 240, such that the portion of the protection layer 210 corresponding to the piezoelectric layer 240 may effectively vibrate based on the sound signal.

In an exemplary embodiment, the vibration corresponding to the sound signal may be converted to an electrical signal in the piezoelectric layer 240, and the electrical signal may be transferred to the first electrode 220 and/or the second electrode 250. In an exemplary embodiment, the first electrode 220 and the second electrode 250 may be electrically connected to the first wiring 280a through a contact 270. Then, a planarization layer 295 may be disposed in a space defined between the second substrate 150 and the third substrate 300.

In an exemplary embodiment, a plurality of the first wirings 280a may be disposed in the non-display region II. In one exemplary embodiment, for example, the first wirings 280a may function as a power wiring or a signal wiring separately. In an alternative exemplary embodiment, the first wirings 280a may function as both a power wiring and the signal wiring using a pull-up resistance.

In an exemplary embodiment, the first wirings 280a may be electrically connected to a power supply terminal ("Vcc"), a microphone positive terminal ("MIC+"), and a microphone negative terminal ("MIC−"), respectively.

In an alternative exemplary embodiment, the first wirings 280a may be electrically connected to a Vcc, a MIC+ and a ground terminal ("GND"), respectively.

In another alternative exemplary embodiment, the first wirings 280a may be electrically connected to a Vcc, MIC− and a GND, respectively.

In another alternative exemplary embodiment, the first wirings 280a may include a first wiring connected to a Vcc and a MIC+, and a second wiring connected to a GND.

According to an exemplary embodiment, the organic light emitting panel 100 may include the microphone 200a embedded in the display region I such that an additional space for receiving the microphone 200a may be omitted in the non-display region II, and the size of the non-display region II may be substantially reduced. In such an embodiment, the hole 260 corresponding to the microphone 200a may be defined not to penetrate the first substrate 110 and the second substrate 150, which may encapsulate the organic light emitting element 125, such that the life time of the organic light emitting element 125 may increase.

Figure 4:
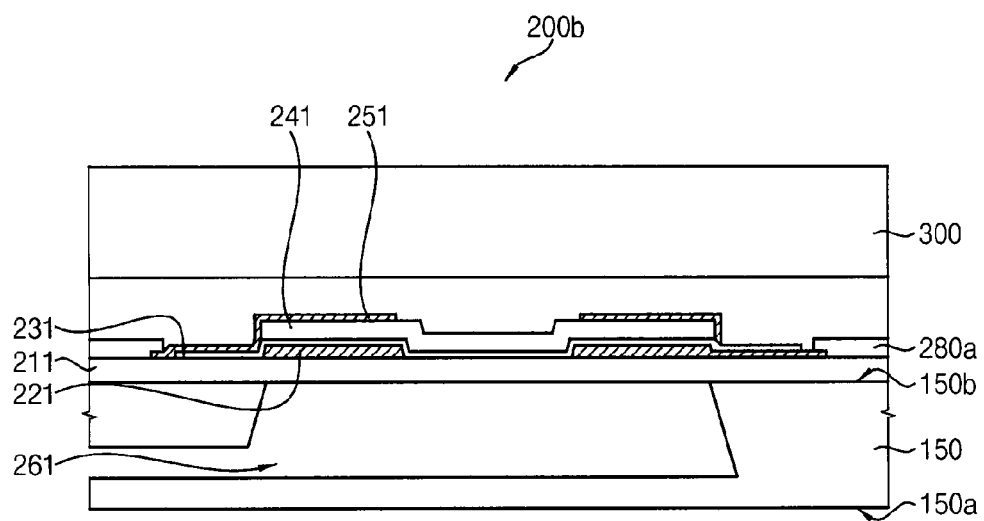
FIG. 4 is an enlarged cross-sectional view of an alternative exemplary embodiment of a microphone, corresponding to region III of FIG. 2.

FIG. 4 is an enlarged cross-sectional view of an alternative exemplary embodiment of a microphone, corresponding to region III in FIG. 2.

The exemplary embodiment of the microphone 200b shown in FIG. 4 is substantially similar to the exemplary embodiment of the microphone 200a described with reference to FIG. 3. In an exemplary embodiment, the microphone 200b may include a protection layer 211, a first electrode 221, a passivation layer 231, a piezoelectric layer 241 and a second electrode 251, which may be sequentially stacked on a second surface 150b of a second substrate 150.

A hole 261 corresponding to the microphone 200b may be defined in an upper portion of the second substrate 150. In an exemplary embodiment, the hole 261 may be defined in the second substrate 150 and not to penetrate the first surface 150a of the second substrate 150. In such an embodiment, the hole 261 under the protection layer 211 may extend from the second surface 150b in a direction substantially perpendicular to the second surface 150b, and then may further extend in a direction substantially parallel to the second surface 150b. Therefore, in such an embodiment, a sound signal may be transferred to the protection layer 211 through the hole 261. In such an embodiment, the hole 261 may not penetrate the second substrate 150 in a thickness direction, such that an organic light emitting element 125 may be effectively encapsulated by the first substrate 110, the second substrate 150 and the sealant 130.

Figure 5:
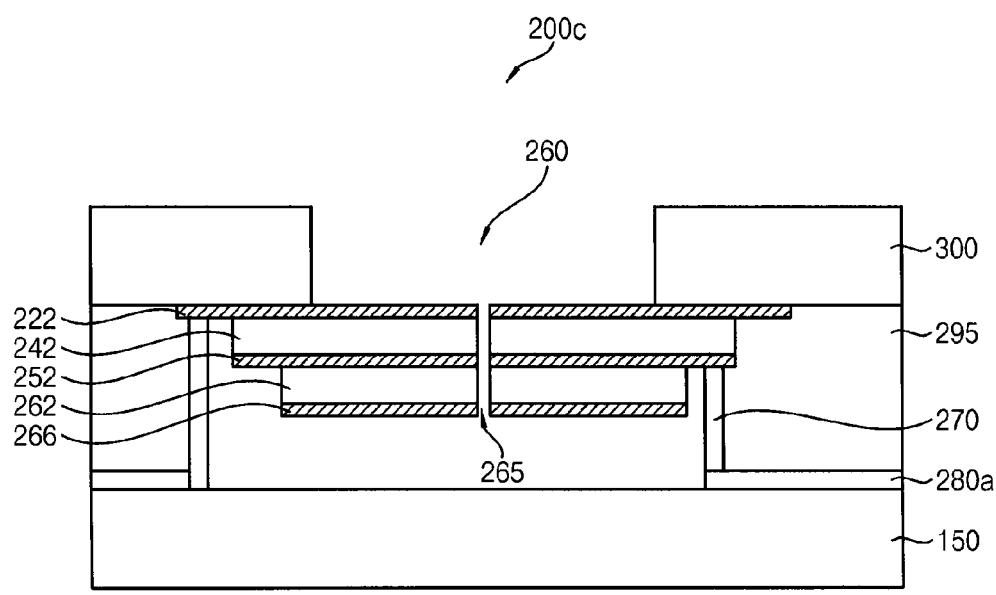
FIG. 5 is an enlarged cross-sectional view of another alternative exemplary embodiment of a microphone, corresponding to region III of FIG. 2.

FIG. 5 is an enlarged cross-sectional view of another alternative exemplary embodiment of a microphone, corresponding to region III of FIG. 2.

Referring to FIG. 5, an exemplary embodiment of the microphone 200c may include a first electrode 222, a first piezoelectric layer 242, and a second electrode 252 which may be sequentially stacked on a surface of a third substrate 300. In such an embodiment, each of the first electrode 222, the first piezoelectric layer 242 and the second electrode 252 may be divided into a plurality of portions, which are spaced apart from each other in a direction substantially parallel to the surface of the third substrate 300 with a gap 265.

A hole 260 defined through the third substrate 300 may be arranged to correspond to the microphone 200c. In such an embodiment, the hole 260 and the gap 265 may allow the first electrode 222, the first piezoelectric layer 242 and the second electrode 252 to effectively deform by a sound signal such that the first electrode 222, the first piezoelectric layer 242 and the second electrode 252 may effectively vibrate based on the sound signal.

In an exemplary embodiment, the microphone 200c may further include a second piezoelectric layer 262 on the second electrode 252 and a third electrode 266 on the second piezoelectric layer 262. In such an embodiment, as shown in FIG. 5, each of the second piezoelectric layer 262 and the third electrode may be may be divided into a plurality of portions, which are spaced apart from each other in a direction substantially parallel to the surface of the third substrate 300 with the gap 265.

In an exemplary embodiment, the first electrode 222, the second electrode 252 and the third electrode 266 may include a conductive metal such as molybdenum or titanium, for example, and the first piezoelectric layer 242 and the second piezoelectric layer 262 may include a piezoelectric ceramic material such as zinc oxide (ZnO), aluminum nitride (AlN), lead zirconium titanate ("PZT"), and the like, for example.

Figure 6:
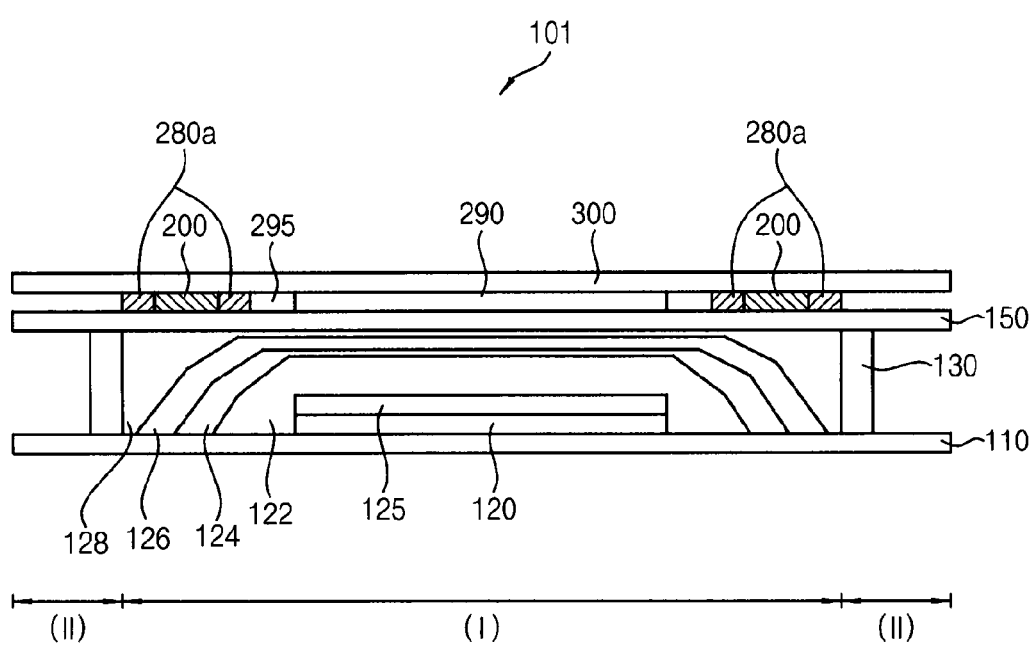
FIG. 6 is a plan view illustrating an alternative exemplary embodiment of an organic light emitting display device.

FIG. 6 is a plan view illustrating an alternative exemplary embodiment of an organic light emitting display device. The exemplary embodiment of the organic light emitting display panel 101 shown in FIG. 6 may be substantially the same as or substantially similar to the organic light emitting display panel 100 described with reference to FIG. 2 except for an organic layer 124, inorganic layers 122 and 126 and a planarization layer 128. The same or like elements shown in FIG. 6 have been labeled with the same reference characters as used above to describe the exemplary embodiments of the organic light emitting display panel 100 shown in FIG. 2, and any repetitive detailed description thereof will hereinafter be omitted or simplified.

In an exemplary embodiment, as shown in FIG. 6, the organic light emitting display device 101 may include the organic layer 124, the inorganic layers 122 and 126 and the planarization layer 128 disposed between the first substrate 110 and the second substrate 150. The organic layer 124, the inorganic layers 122 and 126 and the planarization layer 128 may seal a switching element 120 and an organic light emitting element 125.

In an exemplary embodiment, the organic layer 124 and the inorganic layers 122 and 126 may be alternately stacked as shown in FIG. 6.

The inorganic layers 122 and 126 may effectively prevent contaminants or vapor from contacting the organic light emitting element 125. In one exemplary embodiment, for example, the inorganic layers 122 and 126 may include aluminum oxide (AlOx), titanium oxide (TiOx), magnesium oxide (MgO), tin oxide (SnOx), zinc oxide (ZnOx), copper oxide (CuOx) or silicon oxide (SiOx).

In such an embodiment, the organic layer 124 may relieve an internal stress in the inorganic layers 122 and 126, or fill a micro crack or a pin hole generated in the inorganic layers 122 and 126. In one exemplary embodiment, for example, the organic layer 124 may include an epoxy resin, an acrylate resin, a urethane acrylate resin, or the like.

In such an embodiment, the planarization layer 128 may fill a remaining space between the first substrate 110, the second substrate 150 and the sealant 130. In one exemplary embodiment, for example, the planarization layer 128 may include a material substantially the same as a material of the organic layer 124.

According to an exemplary embodiment, the organic light emitting display device may the sealant 130, the organic layer 124 and the inorganic layers 122 and 126 between the first substrate 110 and the second substrate 120, such that the organic light emitting element 125 may be effectively encapsulated in a space defined between the first substrate 110 and the second substrate 120.

Figure 7:
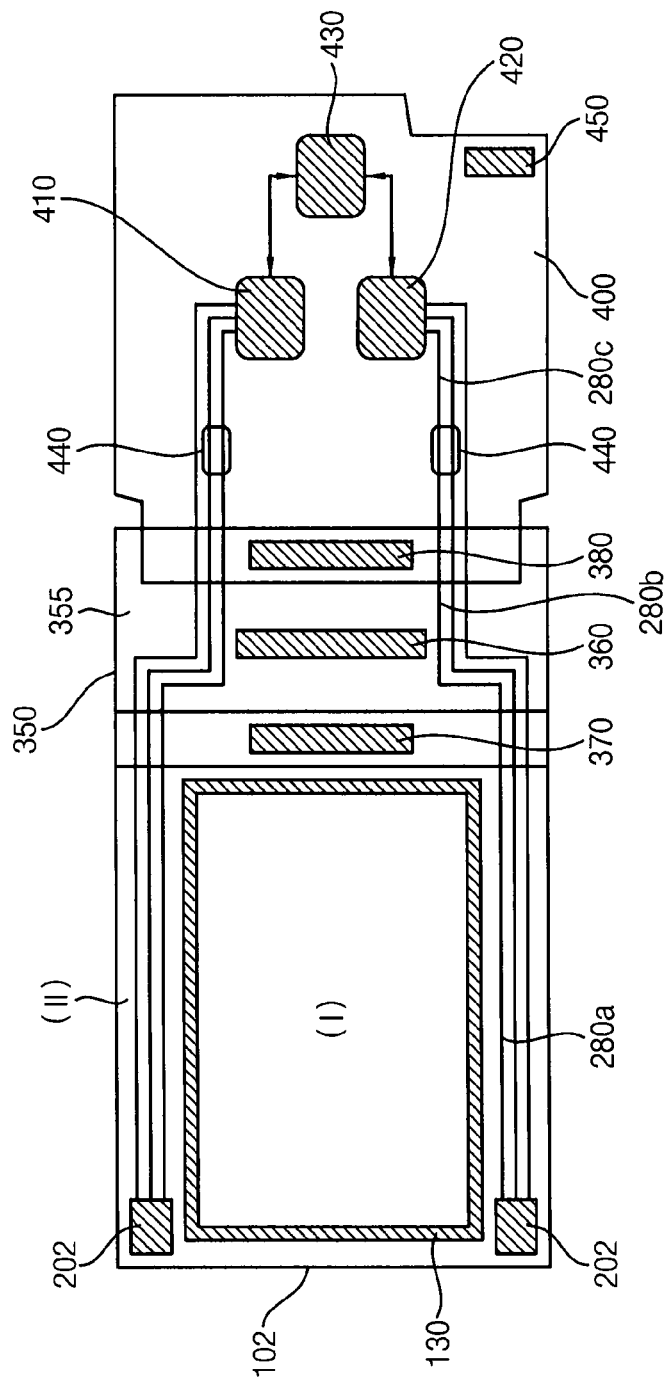
FIG. 7 is a plan view illustrating another alternative exemplary embodiment of an organic light emitting display device.
Figure 8:
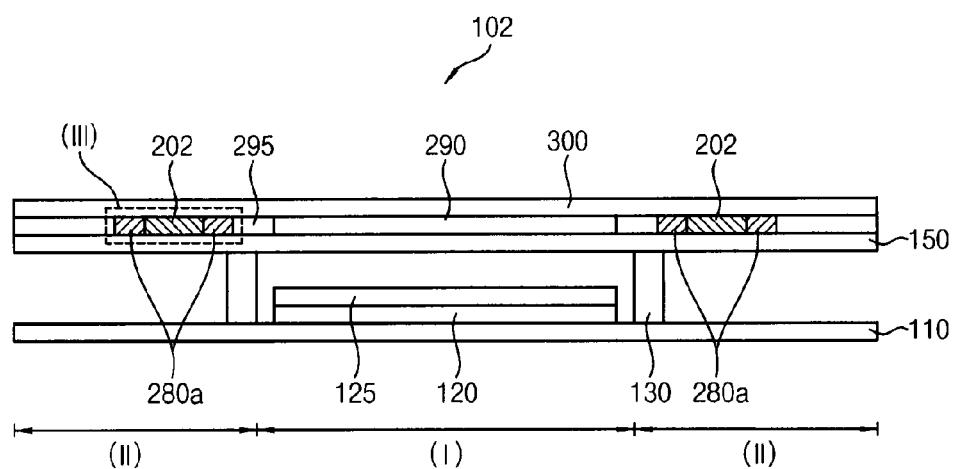
FIG. 8 is a cross-sectional view illustrating region I and region II of the organic light emitting display device shown in FIG. 7.
Figure 9:
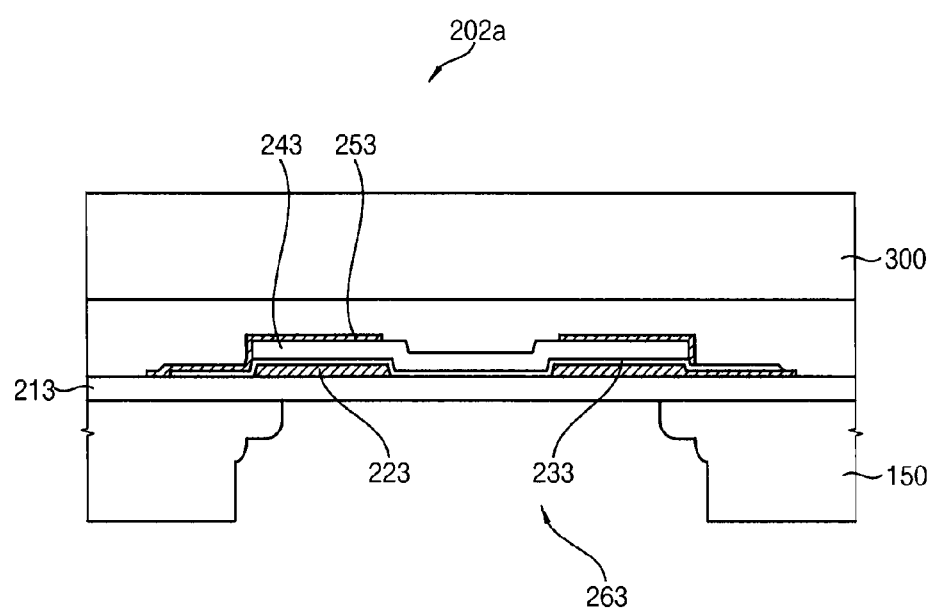
FIG. 9 is an enlarged cross-sectional view of an exemplary embodiment of a microphone, corresponding to region III of FIG. 8.

FIG. 7 is a plan view illustrating an alternative exemplary embodiment of an organic light emitting display device, FIG. 8 is a cross-sectional view illustrating region I and region II of the organic light emitting display device of FIG. 7, and FIG. 9 is an enlarged cross-sectional view of an exemplary embodiment of a microphone corresponding to region III of FIG. 8.

Referring to FIG. 7, an exemplary embodiment of the organic light emitting display device may include an organic light emitting panel 102, a circuit substrate 400 and a wiring substrate 350 that connects the organic light emitting panel 102 and the circuit substrate 400.

The organic light emitting panel 102 shown in FIG. 8 may be substantially the same as or substantially similar to the organic light emitting panel 100 shown in FIG. 2 except for a position of a microphone 202. The same or like elements shown in FIG. 8 have been labeled with the same reference characters as used above to describe the exemplary embodiments of the organic light emitting panel 100 shown in FIG. 2, and any repetitive detailed description thereof will hereinafter be omitted or simplified.

In an exemplary embodiment, as shown in FIG. 8, the organic light emitting panel 102 may include a first substrate 110, a switching element 120, an organic light emitting element 125, a sealant 130, a second substrate 150, the microphone 202, a transparent circuit device and a third substrate 300.

In an exemplary embodiment, as shown in FIG. 7, the microphone 202 may be disposed in a non-display region II on the second substrate 150, and a hole 263 is defined through the second substrate 150. In such an embodiment, the organic light emitting element 125 may be effectively encapsulated by the first substrate 110, the second substrate 150 and the sealant 130 in such an embodiment since the hole 263 of the second substrate 150 is positioned in the non-display region II.

In an exemplary embodiment, the microphone 202 may have various configurations. That is, exemplary embodiments of the microphone, e.g., the microphone 202a illustrated in FIG. 9 and the microphone 202b illustrated in FIG. 10, may have different configurations from each other.

Referring to FIG. 9, an exemplary embodiment of the microphone 202a may include a protection layer 213, a first electrode 223, a passivation layer 233, a piezoelectric layer 243 and a second electrode 253, which may be sequentially stacked on the second substrate 150 having the hole 263. The microphone 202a shown in FIG. 9 may have a configuration substantially the same as the microphone 200a described with reference to FIG. 3.

Figure 10:
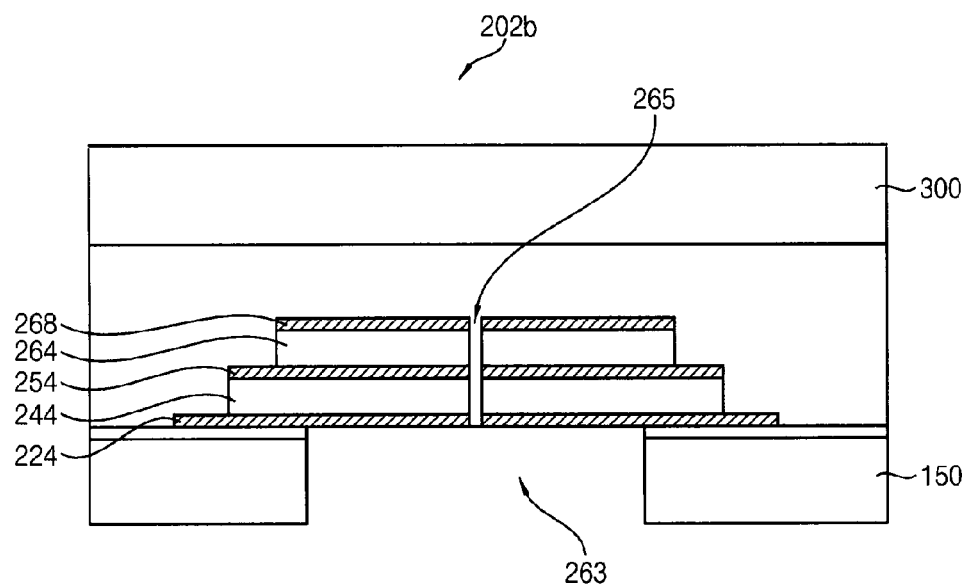
FIG. 10 is an enlarged cross-sectional view of an alternative exemplary embodiment of a microphone, corresponding to region III of FIG. 8.

FIG. 10 is an enlarged cross-sectional view of an alternative exemplary embodiment of a microphone, corresponding to region III of FIG. 8.

Referring to FIG. 10, an exemplary embodiment of the microphone 202b may include a first electrode 224, a first piezoelectric layer 244, and a second electrode 254, which may be sequentially stacked on a surface of a second substrate 150. In such an embodiment, each of the first electrode 224, the first piezoelectric layer 244 and the second electrode 254 may be divided into a plurality of portion, which are spaced apart from each other in a direction parallel to the surface of the second substrate 150 with a gap 265.

In exemplary embodiments, the microphone 202b may further include a second piezoelectric layer 264 on the second electrode 254 and a third electrode 268 on the second piezoelectric layer 264. In such an embodiment, as shown in FIG. 10, each of the second piezoelectric layer 264 and the third electrode may be may be divided into a plurality of portions, which are spaced apart from each other in a direction substantially parallel to the surface of the third substrate 300 with the gap 265. The microphone 202b shown in FIG. 10 may have a configuration substantially the same as the microphone 200c described with reference to FIG. 5.

Figure 11:
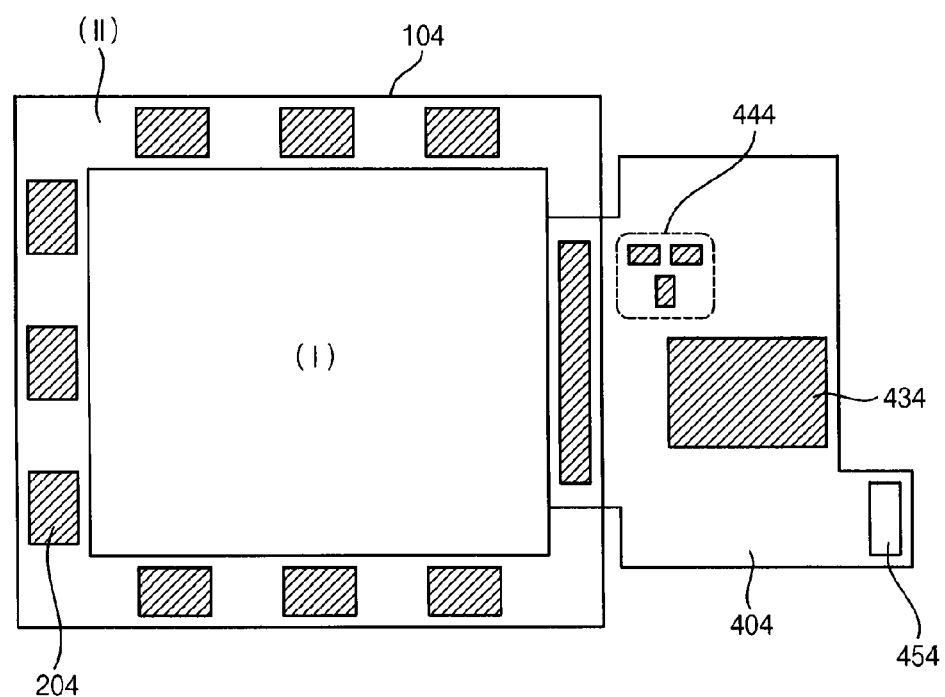
FIG. 11 is a plan view illustrating another alternative exemplary embodiment of an organic light emitting display device.

FIG. 11 is a plan view illustrating an alternative exemplary embodiment of an organic light emitting display device.

Referring to FIG. 11, an exemplary embodiment of the organic light emitting display device may include an organic light emitting panel 104 and a circuit substrate 404. The circuit substrate 404 may include a microphone circuit portion (now shown) and a sound signal processor 434, and the microphone circuit portion and the sound signal processor 434 may be electrically connected to the microphones 204 through wirings (not shown).

The organic light emitting panel 104 may include a display region I and a non-display region II, and may include a plurality of microphones 204 arranged in the non-display region II.

In an exemplary embodiment, the non-display region II may surround the display region I. In an exemplary embodiment, the microphones 204 may be arranged along at least three sides of the non-display region II. In one exemplary embodiment, for example, the microphones 204 may be arranged along an upper side, a left side and a right side of the non-display region II, as shown in FIG. 11. Accordingly, the microphones 204 may form a microphone array.

According to an exemplary embodiment, the organic light emitting display device may include the microphone array, such that the organic light emitting display device effectively detect the sound signal. In one exemplary embodiment, for example, the organic light emitting display device may determine a direction of the sound signal with respect thereto or a position of a source of the sound signal by a calculation. In one exemplary embodiment, for example, the organic light emitting display device may detect a three dimensional sound signal.

Figure 12:
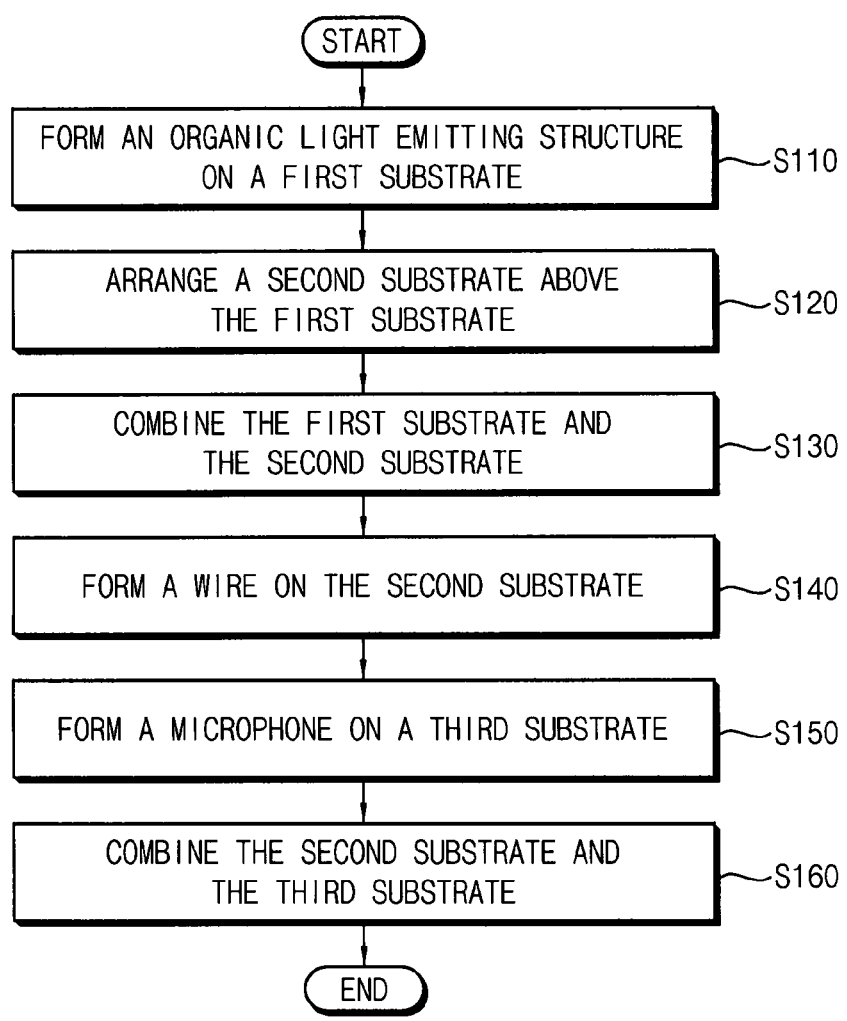
FIG. 12 is a flow chart showing an exemplary embodiment of a method of manufacturing an organic light emitting display device.

FIG. 12 is a flow chart showing an exemplary embodiment of a method of manufacturing an organic light emitting display device.

Referring to FIG. 12, an organic light emitting element may be provided, e.g., formed or disposed, on a first substrate (S110).

In such an embodiment, the first substrate 110 (See FIG. 3) may include a glass substrate, a quartz substrate, a transparent plastic substrate, a transparent ceramic substrate or a flexible substrate, for example. The first substrate 110 may have a display region I and a non-display region II, which are defined thereon.

A switching element 120 (See FIG. 3) and the organic light emitting element 125 (See FIG. 3) may be provided, e.g., formed, on the first substrate 110. An exemplary embodiment of a method of forming the switching element 120 and the organic light emitting element 125 may be a method disclosed in Korean Patent Publication No. 10-2013-0017342.

Then, a second substrate may be provided and disposed, e.g., arranged, above the first substrate (S120). In such an embodiment, the second substrate 150 may be disposed opposite to, facing, the first substrate 110.

Referring to FIG. 12, the second substrate is combined to the first substrate (S130). After providing a sealant 130 (See FIG. 3) between the first substrate 110 and the second substrate 150, the first substrate 110 and the second substrate 150 may be combined by the sealant 130. The sealant 130 may have shape of a closed loop surrounding the display region I when viewed from a top view.

Then, a wiring may be provided, e.g., formed, on the second substrate (S140). In an exemplary embodiment, after forming a conductive layer on the second substrate 150, the conductive layer may be patterned to form the first wiring 280a (See FIG. 3). In an exemplary embodiment, the first wiring 280a and a conductive circuit device 290 may be provided, e.g., formed, in a same process.

A microphone may be provided, e.g., formed, on a third substrate (S150). An exemplary embodiment of the method of providing the microphone 200 (See FIG. 3) will be described later in a detail with reference to FIG. 13.

Then, the third substrate and the second substrate may be combined (S160) to each other. In or after a process of combining the second substrate 150 and the third substrate 300, the first wiring 280a on the second substrate 150 may be electrically connected to the microphone 200 on the third substrate 300.

Accordingly, the organic light emitting display device having an embedded microphone may be manufactured by an exemplary embodiment of the method described above.

FIG. 13 is a flow chart showing an exemplary embodiment of a method of manufacturing an organic light emitting display device including a microphone.

Referring to FIG. 13, a protection layer may be provided, e.g., formed, on a third substrate (S210). In exemplary embodiments, the protection layer 210 (See FIG. 3) may be provided, e.g., formed, on the third substrate 300 (See FIG. 3) by a chemical vapor deposition process or a physical vapor deposition process. The protection layer 210 may have a thickness in a range of about 1 micrometer (μm) to about 10 micrometers (μm).

Then, the third substrate may be partially removed to form a hole (S220). In an exemplary embodiment, the hole 260 (See FIG. 3) may be formed through the third substrate 300 by a back side etching process. In such an embodiment, the third substrate 300 and the protection layer 210 may have an etch selectivity, such that the protection layer 210 may function as an etch stop layer during the back side etching process.

Referring now to FIG. 13, a first electrode may be provided, e.g., formed, on the protection layer (S230). In an exemplary embodiment, a conductive layer may be formed on the protection layer 210, and then the conductive layer may be patterned to provide the first electrode 220 (See FIG. 3).

Then, a passivation layer may be provided, e.g., formed, to cover the first electrode (S240). The passivation layer 230 (See FIG. 3) may be provided, e.g., formed, on the protection layer 210 to cover the first electrode 220. In one exemplary embodiment, for example, the passivation layer 230 may be formed by a chemical vapor deposition ("CVD") process or an atomic layer deposition process using silicon oxide.

A piezoelectric layer may be provided, e.g., formed, on the passivation layer (S250). The piezoelectric layer 240 (See FIG. 3) may be formed using ZnO, AlN or PZT. The piezoelectric layer 240 may be provided in a position corresponding to the hole 260.

Then, a second electrode may be provided, e.g., formed, on the piezoelectric layer (S260). In such an embodiment, a conductive layer may be formed on the piezoelectric layer 240, and then the conductive layer may be patterned to provide the second electrode 250

Accordingly, the film type microphone may be manufactured by an exemplary embodiment of the method described above.

According to exemplary embodiments, the organic light emitting panel may include the microphone embedded in the display region I. Therefore, in such embodiments, an additional space for receiving the microphone may be omitted in the non-display region II, and the size of the non-display region II may be thereby substantially reduced. In such embodiments, the hole corresponding to the microphone may be defined not to penetrate the first substrate and the second substrate which may encapsulate the organic light emitting element, such that the life time of the organic light emitting element may increase. Exemplary embodiments of the invention may include a system having an organic light emitting display device. Exemplary embodiments of the system having an organic light emitting display device includes, for example, a computer monitor, a laptop, a digital camera, a cellular phone, a smart phone, a smart pad, a television, a personal digital assistant ("PDA"), a portable multimedia player ("PMP"), a MP3 player, a navigation system, a game console, and a video phone, but not being limited thereto.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An organic light emitting display device, comprising:
a first substrate, on which a display region, and a non-display region surrounding the display region are defined;
a second substrate disposed opposite to the first substrate an organic light emitting element disposed in the display region between the first substrate and the second substrate;

a third substrate disposed opposite to the second substrate;

a microphone disposed between the second substrate and the third substrate; and a hole corresponding to the microphone defined in one of the second substrate and the third substrate, wherein the microphone is disposed in the display region.

2. The organic light emitting display device of claim 1, wherein the microphone comprises a first electrode, a piezoelectric layer and a second electrode, which are disposed on a surface of the third substrate, and a hole corresponding to the microphone is defined through the third substrate.

3. The organic light emitting display device of claim 2, wherein each of the first electrode, the piezoelectric layer and the second electrode is divided into a plurality of portions, which are spaced apart from each other in a direction substantially parallel to the surface of the third substrate, with a gap.

4. The organic light emitting display device of claim 1, wherein the microphone comprises a first electrode, a piezoelectric layer and a second electrode, which are disposed on a surface of the second substrate, and a hole corresponding to the microphone is defined in the second substrate.

5. The organic light emitting display device of claim 4, wherein the hole extends in a direction substantially parallel to the surface of the second substrate.

6. The organic light emitting display device of claim 4, wherein the piezoelectric layer comprises zinc oxide, aluminum nitride or lead zirconium titanate.

7. The organic light emitting display device of claim 1, wherein the microphone is disposed in the non-display region.

8. The organic light emitting display device of claim 7, wherein the microphone comprises a first electrode, a piezoelectric layer and a second electrode, which are disposed on a surface of the second substrate, a hole corresponding to the microphone is defined through the second substrate.

9. The organic light emitting display device of claim 1, further comprising:

a circuit substrate comprising a microphone circuit portion, a sound signal processor and a microphone impedance matching block, wherein the microphone is electrically connected to the microphone circuit portion, the sound signal processor and the microphone impedance matching block by a wiring.

10. The organic light emitting display device of claim 1, wherein a plurality of microphones is disposed in the non-display region, and the microphones are disposed adjacent to at least three sides of the display region.

11. The organic light emitting display device of claim 10, wherein the microphones detect a three dimensional sound signal.

12. A method of manufacturing an organic light emitting display device, the method comprising:

providing a first substrate, on which a display region, and a non-display region surrounding the display region, are defined;

providing an organic light emitting element in the display region on the first substrate;

providing a second substrate to face the first substrate;

combining the first substrate and the second substrate to encapsulate the organic light emitting element therebetween;

providing a microphone on a third substrate, wherein the microphone is disposed in the display region;

providing a hole corresponding to the microphone in one of the second substrate and the third substrate; and combining the second substrate and the third substrate.

13. The method of claim 12, further comprising:

providing a wiring on the second substrate before the combining the second substrate and the third substrate, wherein the combining the second substrate and the third substrate comprises electrically connecting the wiring with the microphone.

14. The method of claim 12, wherein the providing the microphone on the third substrate comprises:

providing a protection layer on the third substrate;

partially removing the third substrate to form a hole therein;

providing a first electrode on the protection layer;

providing a piezoelectric layer on the first electrode; and providing a second electrode on the piezoelectric layer.

* * * * *